US006621336B1

(12) United States Patent
Johnson

(10) Patent No.: US 6,621,336 B1
(45) Date of Patent: Sep. 16, 2003

(54) OVER-CURRENT PROTECTION TECHNIQUE

(75) Inventor: Nick M. Johnson, Los Altos, CA (US)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 10/007,428

(22) Filed: Dec. 3, 2001

(51) Int. Cl.[7] .................................................. H03F 1/14
(52) U.S. Cl. .......................................... 330/51; 381/120
(58) Field of Search ............................. 330/51, 207 P; 381/120, 121

(56) References Cited

U.S. PATENT DOCUMENTS 5,568,342 A * 10/1996 Tavazzani et al. .......... 330/298
5,982,231 A * 11/1999 Nalbant ........................ 330/10
6,111,965 A * 8/2000 Lubbe et al. .................. 330/51

* cited by examiner

*Primary Examiner*—Robert Pascal
*Assistant Examiner*—Khanh Van Nguyen
(74) *Attorney, Agent, or Firm*—Wagner, Murabito & Hao LLP

(57) ABSTRACT

The present invention relates to a method for over-current protection of an amplifier circuit, which comprises driving an electronic load with the output of the amplifier circuit and sensing for a fault condition in the load, such as a short or over-current condition. The amplifier is switched off in response to the fault condition and can stay off for a specified time delay and the amplifier is then switched on. The fault condition is tested for again and, if cured, the amplifier can remain on until a new fault condition is detected. If the fault condition remains, testing and switching the amplifier on and off over very short time periods results in an effectively limited current in the load.

19 Claims, 4 Drawing Sheets

OVER-CURRENT PROTECTION TECHNIQUE

FIELD OF THE INVENTION

The present invention relates to the field of self protection circuitry in audio power amplifiers.

BACKGROUND OF THE INVENTION

The ongoing world-wide explosion in telecommunications continues to fuel development in many areas, including audio power amplifiers. Cell phones, especially those equipped as speakerphones, depend a great deal on power amplification.

Switching power amplifiers are a common implementation in modern telecommunications devices. A switching power amplifier is analogous to a switching regulator, differing mainly in the bandwidth of the processed signals (DC in the case of the regulator, 20–20 kHz for a power amplifier). Both concepts use a strategy of turning the control device fully ON or OFF (both low dissipation conditions) in a planned way to deliver power to the load with an average value that is representative of the input signal. Besides the obvious advantage of reduced dissipation compared to their linear equivalents, they can deliver power more efficiently to the load if appropriate non-dissipative filter elements are used between the regulator/amplifier and the load.

A switching power amplifier must respond to an input signal and switch ON or OFF in response to the input. The input must be sampled and, in most implementations, the outputs are rapidly switched on and off at least twice for each sampling of the input. Theoretically, since device outputs are either completely on or completely off, they do not dissipate any power. If a device is on there is a large amount of current flowing through it, but all the voltage is across the driven load, so the power dissipated by the device is zero; and when the device is off, the voltage is large, but the current is zero so the same zero power is dissipated.

Both power amplifiers and power regulators can utilize modulators of various sorts to process the input signal into the ON/OFF drive waveforms required for low dissipation/high efficiency. Popular methods in use can include PWM (Pulse-Width Modulation) and Delta-Sigma modulation (a form of PDM or Pulse-Density-Modulation).

A problem, though, lies in the fact that present devices respond well to changes in input levels but not to fault level output changes. If a load is shorted or some other over-current condition exists, the input response switching may not respond in time to prevent damage to the amplifier or the load.

One method currently used to detect over-current faults is by way of a thermal rise detection in the amplifier chip. The limitation in this method is that there must be a current flow or the chip temperature decreases. The time delay of this protection method results in a thermal cycling of the circuit with an attendant shortening of device life if not imminent destruction.

What is needed, then, is a means for protecting an audio amplifier over-current conditions in the amplifier's output that does not allow the device heat build-up associated with a thermal protection technique. A further need exists for a device implementing such a means to sample for the continued existence of a fault and switch on when the fault no longer exists.

SUMMARY OF THE INVENTION

The present invention pertains to a method for protecting audio amplifier circuits and their loads from shorts and other over-current conditions that avoids the device heat build-up associated with a thermal-sensing protection technique. The disclosed method provides a means for switching an amplifier off in response to a fault condition in the amplifier's output, sampling for the fault and switching on when the fault no longer exists.

The present invention relates to a method for over-current protection of an amplifier circuit, which comprises driving an electronic load with the output of the amplifier circuit and sensing for a fault condition in the load, such as a short or over-current condition. The amplifier is switched off in response to the fault condition and can stay off for a specified time delay and the amplifier is then switched on. The fault condition is tested for again and, if cured, the amplifier can remain on until a new fault condition is detected. If the fault condition remains, testing and switching the amplifier on and off over very short time periods results in an effectively limited current in the load.

BRIEF DESCRIPTION OF THE DRAWING

The operation and components of this invention can be best visualized by reference to the drawing.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention. Occasional reference will be made, in this discussion, to the attached drawings for clearer explanation of some concepts.

The embodiment of the present invention discussed in this description concerns audio power amplifiers such as are used to drive loudspeakers and transducers in telecommunications devices. Loads such as loudspeakers are occasionally subject to shorts or other over-current conditions that can be damaging and destructive to both the load and the amplifier. This is especially true as power amplifiers get ever smaller. The embodiment of the present invention discussed here proposes a method for protecting the amplifier from damage by inadvertent short circuits at its output to the power rails and to other amplifier outputs. The method uses a technique other than current limiting and thermal shutdown which are the current methods in practice.

A switching audio power amplifier uses a modulator to process input signals into the "on or off" drive waveforms necessary for low dissipation and high efficiency. The processed input usually takes on the form of a stream of logical ones or zeroes, which are relatively high or low voltages. The input stream must be converted by a low resistance power buffer into signal levels approaching Vdd, the positive supply voltage, and Vss, the negative supply voltage, at significant load currents. Because of the voltage limitations of such buffer circuits, it is common practice to drive both sides of a load's impedance with opposite phase signals, Vdd and Vss, in order to double the available voltage applied to the load.

Figure 1:
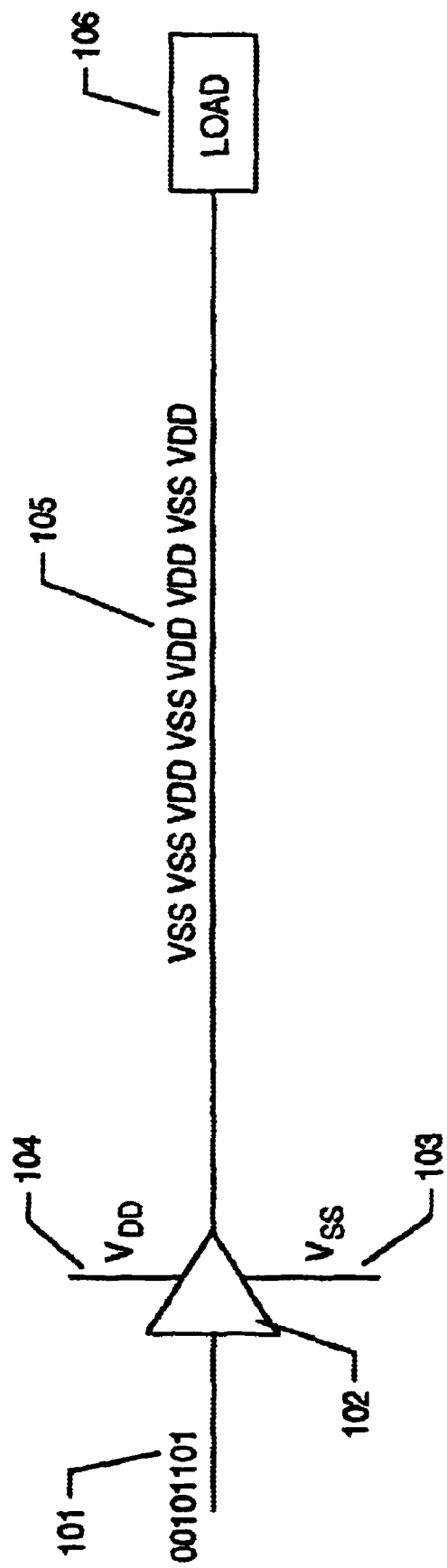
FIG. 1 illustrates the mode of operation of a switching power amplifier in accordance with embodiments of the present invention.

This conversion operation is illustrated in FIG. 1. There, the input to buffer 102 is a series of relatively high and low voltages, 101, which is the output stream from a modulator. Buffer 102 is supplied with a positive supply voltage, Vdd at 104, and a negative supply voltage, Vss at 103. Note that the input word, "00101101," is matched by the output voltage stream "Vss Vss Vdd Vss Vdd Vdd Vss Vdd" at 105 with "0" in resulting in Vss out and "1" in resulting in Vdd out. Hence the load 106 is driven with the Vdd/Vss equivalent to the input.

When a logic "1" is commanded at the input of the buffer, load current flows from the Vdd supply pin 104 to the output 105 and the load 106. Because the buffer is low resistance, the output voltage approaches Vdd for any normally encountered load resistance. Current flow can be substantial but dissipation in the buffer is small because the voltage drop from Vdd to the output is small. If a short occurs between the output and Vss, for example, high current will flow when Vdd is commanded at the output due to the low resistance of the buffer; full voltage also is present from Vdd to output (Vss now). This simultaneous occurrence of high current and full voltage results in rapid heating of the circuit and, unless it is limited in some way, it will result in the destruction of the circuit.

The rapid rise in the temperature of the die surface in which an amplifier is implemented can be sensed electronically and used to command turnoff of the destructive current and cool-down of the die surface. Since permanent shutdown of the circuit is not usually desired, retrial of the output repeatedly results in a thermal cycling loop. The repeated heating and cooling of the die surface is undesirable due to thermal coefficient of expansion differences in the mounting structures which results in mechanical stress. Further cycling at high average temperatures can affect the molding compound/silicon interface. This embodiment of the present invention presents a new short-circuit protection strategy which can reduce the extent of the temperature change during a short condition and also reduce the attendant stress.

Unlike linear power amplifiers, switching power amplifiers do not, under any circumstances, have to reproduce the continuous range of voltages between Vdd and Vss at their outputs. They only have to supply voltages substantially equal to Vss or Vdd. This restricted legitimate output voltage range provides an alternative to thermal shutdown as a means of circuit protection: merely detect an output voltage outside of the commanded output range and immediately disable the output current. Of course, if the fault is to the same voltage as commanded, the fault cannot be detected, but no harm can result as there is no current flow. Upon command of the opposite state, this type of fault can be detected as described above.

In addition to both Vss and Vdd shorts that are discussed above, there also exists the possibility of output-to-output shorts in the case where both sides of the load are driven by two separate buffers. In this case, either one buffer will have lower output resistance and dominate the common output voltage (bring it within its commanded output range) resulting in a fault detected at the other output, or the common output voltage will sit at mid-scale, resulting in both of the buffers being out of commanded range and both reporting a fault.

Figure 2:
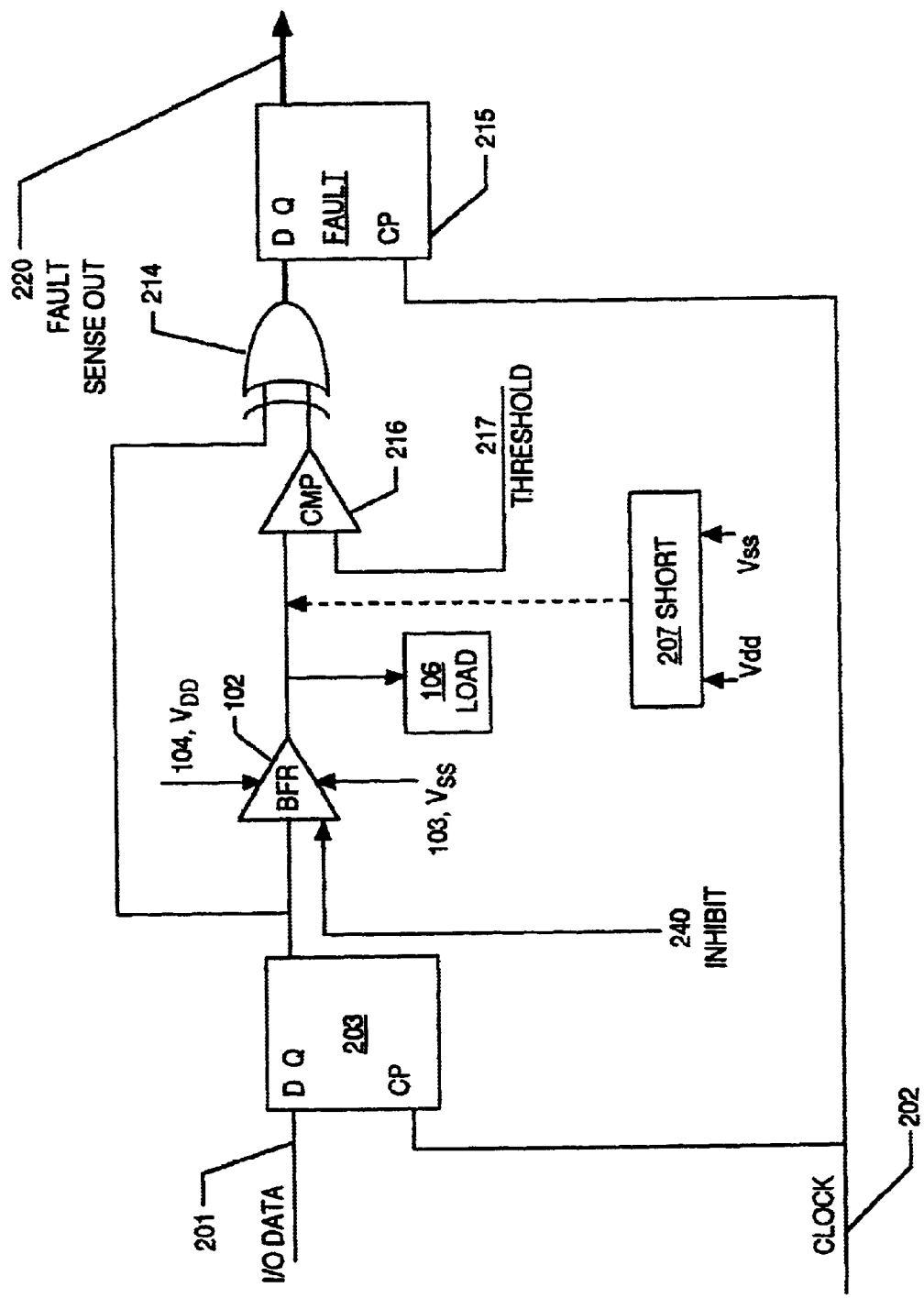
FIG. 2 illustrates an implementation of a switching power amplifier with fault sensing in accordance with embodiments of the present invention.

This detection means is implemented in this embodiment of the present invention as a comparator and exclusive OR gate as illustrated in FIG. 2. There, the data input stream is realized as data input 201, which is input to flip-flop 203 into which it is latched with each rising edge of clock signal 202. Note that clock signal 202 is, in this implementation, a relatively high frequency signal on the order of 6 MHz. The output signal of flip-flop 203 is input to buffer 102 which converts the data stream to an analogous voltage stream of Vdd and Vss levels. If inhibit signal 240 is not activated, buffer 102 sends Vdd 104 or Vss 103 to load 106 as required. A sample of the buffer output is also sent to comparator 216 whose output is one input to exclusive OR gate 214 whose other input is a direct path from the output of flip-flop 203.

Figure 3:
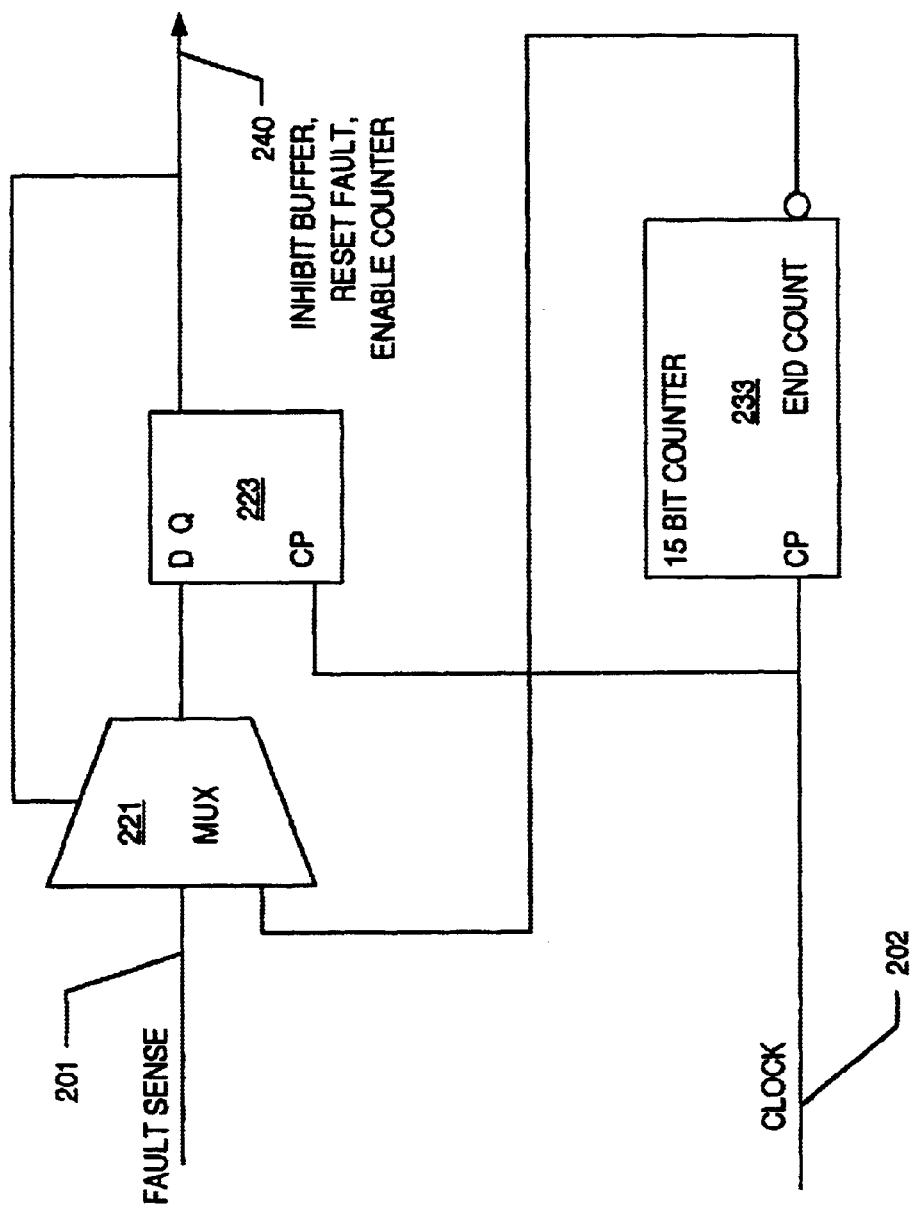
FIG. 3 illustrates an implementation of a fault sensing and start delay circuit in accordance with embodiments of the present invention.

The output of power buffer 102 may be compromised in voltage due to shorts to the supply rails (Vdd, Vss) or excessive loads, as alluded to by box 207. Comparator 216, being in this second path, tests the buffer output voltage against a reference threshold voltage 217, in effect testing the magnitude of the short or overload, if present, against the source impedance of the buffer. If the same logic level exists at each input of the XOR gate, the result is in a logic zero being presented to Fault flip-flop 215, where it is latched on the next rising edge of clock signal 202 and presented to the START/FAULT logic described and illustrated in FIG. 3.

When the power amplifier at the heart of this discussion of this embodiment of the present invention is running normally, with buffer output enabled, start flip-flop 223 is reset and multiplexer 221 couples the fault signal to the input of start flip-flop 223. If fault flip-flop 215 sends a logic "true", start flip-flop 223 goes true one clock pulse later. The multiplexer 221 is directed to the end count line from the 15 bit counter 233 so that when end-of-count occurs, start flip-flop 223 is reset and the output is re-enabled to test for fault removal. In effect, the output duty cycle is reduced to one out of 32,000 clock pulses at 6 MHz, or about 160 ns out of each 5 ms. This should not transmit enough energy to damage the buffer circuit. It should be noted here that this method of protection is applicable to any power buffer with a fixed number of commandable output states and faults that cause the output to depart from the commanded state in a measurable way.

Figure 4:
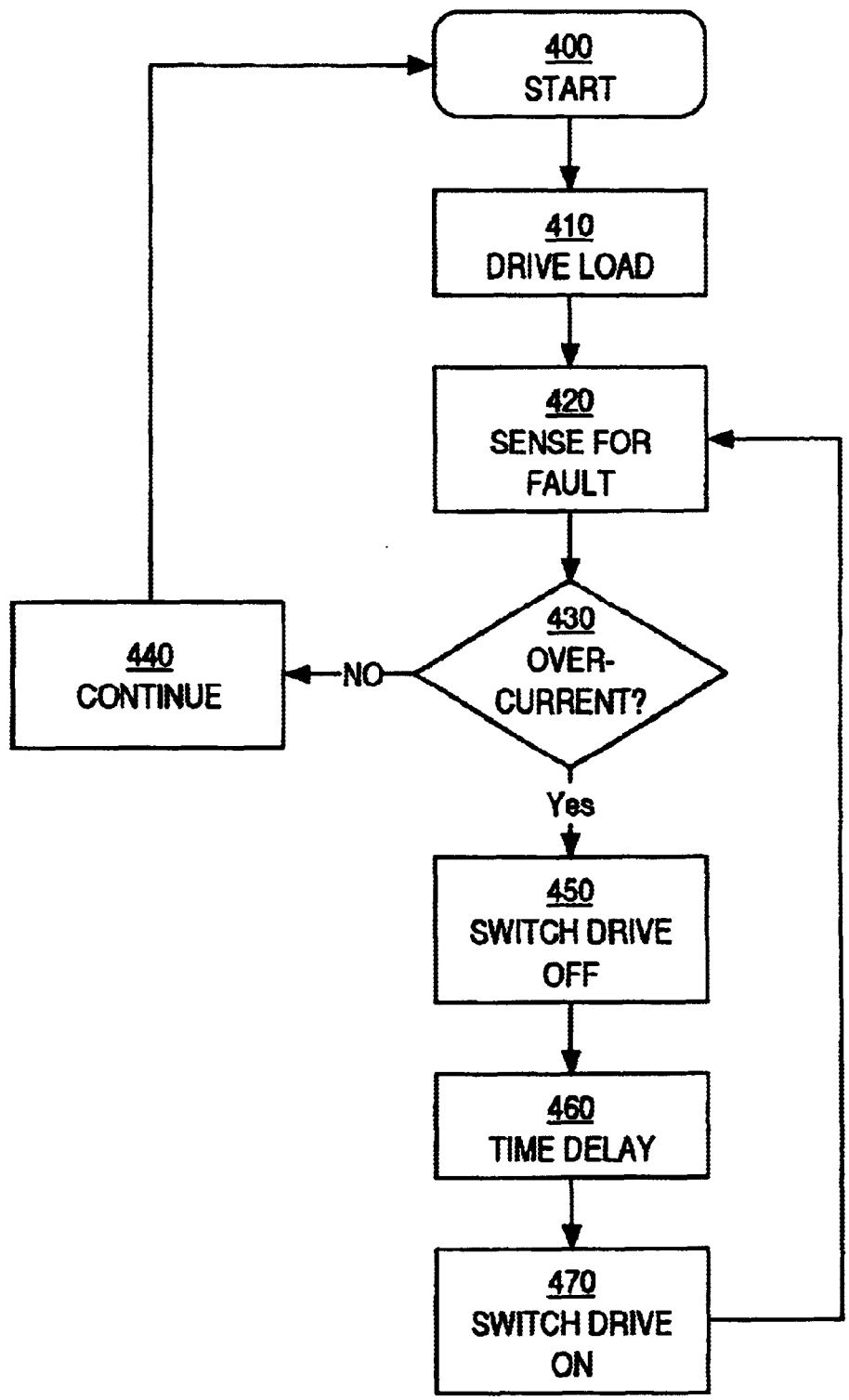
FIG. 4 illustrates a block flow diagram a switching power amplifier with fault sensing in accordance with embodiments of the present invention.

FIG. 4 illustrates, in block flow diagram form, a process in accordance with the description above. Process 400 starts and commences to drive the applicable load at 410. With each transmission of driving voltage, Vdd or Vss, check is made for a possible fault at 420. If none is sensed at 430, the process continues, 440, and operation proceeds as normal. If a fault is sensed at 430, the buffer output is disabled at 450. Following the time delay at 460, the buffer is re-enabled at 470 and the fault sensing process tests again at 420.

A novel method for over-current protection in a power amplifier has been disclosed. The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A method for over-current protection of an amplifier circuit, comprising:

driving an electronic load with an output of said amplifier circuit;

sensing a fault condition in said load;

switching said amplifier circuit off in response to said fault condition; and switching said amplifier circuit on, wherein said switching on and off limits a current in said amplifier circuit.

2. A method as described in claim 1, wherein said fault condition is an electrical short.

3. A method as described in claim 1, wherein said fault condition is an over-current condition.

4. A method as described in claim 1, wherein said switching said amplifier circuit on is accomplished after sensing the elimination of said fault condition.

5. A method as described in claim 1, wherein said switching said amplifier circuit on is accomplished after a selected period of time.

6. A method as described in claim 1, wherein said switching said amplifier circuit on and off is commanded by an electronic circuit.

7. An electronic circuit, comprising:

an amplifier;

a load electronically driven by an output of said amplifier;

a voltage source electronically coupled to said amplifier;

a command input to said amplifier, wherein said command input is enabled to switch said amplifier on or off; and a sensing element enabled to sense a fault condition in said load and enabled to control said command input.

8. An electronic circuit as described in claim 7, wherein said electronic circuit is an audio power amplifier.

9. An electronic circuit as described in claim 7, wherein said electronic circuit comprises an integrated circuit device.

10. An electronic circuit as described in claim 7, wherein said load is an audio output device.

11. An electronic circuit as described in claim 7, wherein said voltage source is enabled to provide a positive supply voltage.

12. An electronic circuit as described in claim 7, wherein said voltage source is enabled to provide a negative supply voltage.

13. An electronic circuit as described in claim 7, wherein the gain of said amplifier is unity.

14. An audio power amplifier, comprising

An audio power amplifier, a power buffer enabled to output a voltage in conformance with an input to said power buffer;

an electronic load electronically coupled to said output of said power buffer;

a comparator electronically coupled to said output of said power buffer and enabled to compare a voltage in said output to a reference; and a fault sensing circuit electronically coupled to said output of said power buffer enabled to inhibit operation of said power buffer, wherein said input to said power buffer comprises a stream of logical ones and zeroes.

15. An audio power amplifier as described in claim 14, wherein said output voltage can be a negative supply voltage.

16. An audio power amplifier as described in claim 14, wherein said output voltage can be a positive supply voltage.

17. An audio power amplifier as described in claim 14, wherein said electronic load comprises an audio output device.

18. An audio power amplifier as described in claim 14, wherein said comparator is enabled to send a fault signal to said fault sensing circuit in the event of an electronic fault in said power buffer output.

19. An audio power amplifier as described in claim 14, wherein the output signal from said fault sensing circuit is a buffer inhibiting signal and wherein said buffer inhibiting signal is reset after a time delay.

* * * * *